(12) United States Patent
Delshadpour et al.

(10) Patent No.: US 11,038,346 B1
(45) Date of Patent: Jun. 15, 2021

(54) ESD PROTECTION

(71) Applicant: NXP B.V., Eindhoven (NL)

(72) Inventors: Siamak Delshadpour, Phoenix, AZ (US); Dolphin Abessolo Bidzo, Nijmegen (NL)

(73) Assignee: NXP B.V., Eindhoven (NL)

( * ) Notice: Subject to any disclaimer, the term of this patent is extended or adjusted under 35 U.S.C. 154(b) by 8 days.

(21) Appl. No.: 16/731,785

(22) Filed: Dec. 31, 2019

(51) Int. Cl.
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0259* (2013.01); *H01L 27/0292* (2013.01)

(58) Field of Classification Search
CPC . H02H 9/046; H01L 27/0259; H01L 27/0292; H01L 27/0255
USPC .......................................................... 361/56
See application file for complete search history.

(56) References Cited

U.S. PATENT DOCUMENTS

| | | | | |
|---|---|---|---|---|
| 5,124,877 A | * | 6/1992 | Graham | H01L 27/0255 361/212 |
| 5,276,582 A | * | 1/1994 | Merrill | H01L 27/0255 361/111 |
| 5,287,241 A | * | 2/1994 | Puar | H01L 27/0248 257/357 |
| 5,508,649 A | * | 4/1996 | Shay | H03K 17/0822 327/143 |
| 5,862,031 A | | 1/1999 | Wicker et al. | |
| 7,223,475 B2 | * | 5/2007 | Kumar | G03G 9/10 428/407 |
| 7,974,053 B2 | | 7/2011 | Ker et al. | |
| 10,535,647 B2 | * | 1/2020 | Chen | H02H 9/046 |
| 10,826,290 B2 | * | 11/2020 | de Raad | H01L 27/0292 |
| 2006/0050453 A1 | * | 3/2006 | Duwury | H01L 27/0292 361/56 |
| 2006/0092590 A1 | * | 5/2006 | Chuang | H01L 27/0285 361/91.1 |
| 2007/0279824 A1 | * | 12/2007 | Mallikararjunaswamy | H01L 29/87 361/118 |
| 2010/0328826 A1 | * | 12/2010 | Salman | H01L 27/0802 361/56 |
| 2014/0307355 A1 | * | 10/2014 | Tsai | H03F 3/195 361/56 |
| 2014/0362481 A1 | * | 12/2014 | Prabhu | H02H 9/046 361/56 |
| 2015/0263505 A1 | * | 9/2015 | Takada | H02H 9/046 361/56 |

* cited by examiner

*Primary Examiner* — Dharti H Patel
(74) *Attorney, Agent, or Firm* — Rajeev Madnawat

(57) ABSTRACT

An integrated circuit (IC) is disclosed. The IC includes a pin to electrically connect the IC to an external circuit and a transistor that includes a base, a collector and an emitter. The pin is coupled to an internal circuit that is configured to operate in a preselected operating frequency range. The base is coupled to the pin and a resistor is coupled between the base and the pin. The IC further includes an electrostatic discharge (ESD) rail coupled to the pin through a first ESD diode. A second ESD diode is coupled between the floating ESD rail and a power supply to provide a second ESD current sink path.

14 Claims, 2 Drawing Sheets

ESD PROTECTION

BACKGROUND

Electrostatic discharge (ESD) is known to damage sensitive microelectronic devices. ESD results from charges collecting on a surface. The surfaces of nonconductive materials develop equal and opposite charges when they come in contact, move against each other and then separate quickly. ESD sparks occur in many different environments: A person walking on a carpeted floor can generate high-static voltages due to triboelectric charging, and voltages as high as 20 kV have been reported. Likewise, machines that use plastic parts can hold an electrostatic charge due to the plastic rubbing against other plastic parts.

Many electronic components are sensitive to electrostatic voltage as low as 30V and current as low as 0.001 A. Increasingly thinner layers in semiconductor devices have made ESD a growing threat. CMOS devices with small device geometries are particularly susceptible to failure. In wireless applications, such as GPS, WLAN or Wi-Fi devices, the antenna can act as a low-impedance path for ESD to enter the system and damage downstream circuitry.

When electrostatic charge comes in contact with an integrated circuit (IC) chip, ESD will be discharged to the IC chip, consequently causing damage to the IC's internal circuitry. To prevent ESD damage to the internal circuitry, various kinds of ESD protection circuits have been proposed. Typically, a floating ESD rail connects the pins of pads of the IC chip to arrest ESD spikes.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

The term "pin" as used herein means a metallic protrusion in an IC that provides a way to electrically connect a circuit that is external to the IC with the IC.

In one example, an integrated circuit (IC) is disclosed. The IC includes a pin to electrically connect the IC to an external circuit and a transistor that includes a base, a collector and an emitter. The pin is coupled to an internal circuit that is configured to operate in a preselected operating frequency range. The base is coupled to the pin and a resistor is coupled between the base and the pin. The IC further includes an electrostatic discharge (ESD) rail coupled to the pin through a first ESD diode. A second ESD diode is coupled between the floating ESD rail and a power supply to provide a second ESD current sink path.

The internal circuit is coupled to the emitter of the transistor and the collector of the transistor is coupled with the power supply. In some examples, the lower end of the preselected minimum operating frequency range is greater than 1 GHz.

In some embodiments, the resistor is less than 100 ohms in value and the size of the transistor is less than 28 $\mu m^2$ to provide a higher cut-off frequency of an RC filter created by the resistor and an parasitic capacitance of the transistor. The transistor is a heterojunction bipolar transistor to provide a better faster operating performance to support a frequency range in GHz.

The IC may include a second floating ESD rail coupled to the second ESD diode, wherein the second floating ESD rail includes a diode coupled across terminals of the second ESD rail. A third ESD diode may be coupled between the pin and the ground. The value of the resistor, the first ESD diode and the second ESD diode is preselected based on the preselected minimum operating frequency range.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
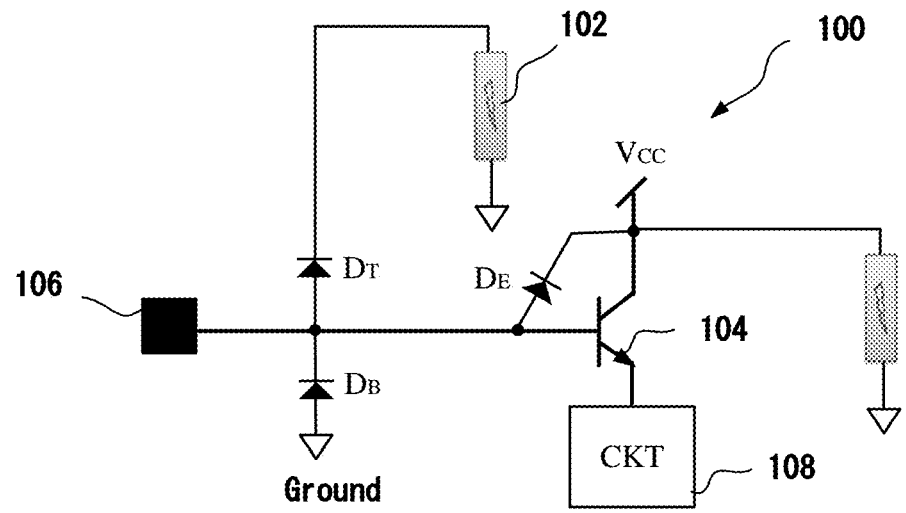
FIG. 1 depicts a circuit with an ESD protection using a bypass diode in accordance with one or more embodiments of the present disclosure.

Note that figures are not drawn to scale. Not all components in the chip are shown. The omitted components are known to a person skilled in the art.

DETAILED DESCRIPTION

Many well-known manufacturing steps, components, and connectors have been omitted or not described in details in the description so as not to obfuscate the present disclosure.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", "one example", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

To adequately safeguard an integrated circuit (IC) from the damaging effects of ESD overvoltage stress, an IC level ESD protection circuits are used. Typically called "ESD clamp" or "ESD rail", the ESD protection circuits are fabricated inside the IC and are coupled with the pins of the IC to arrest electrostatic spikes that can damage the internal components of the IC. For low frequency operations (e.g., in MHz range or less), a typical ESD clamp can effectively protect the internal circuit of the IC. However, at higher frequencies (e.g., in GHz range) and to handle higher electrostatic voltage (e.g., 2 KV, lower or higher depending on specific user requirements), typical ESD clamp circuit alone may not be sufficient. For example, at higher frequencies, the parasitic capacitance caused by the components of the IC would reduce the frequency bandwidth. The embodiments described herein provides additional bypass paths for the current caused by an ESD event without reducing the operational speed of the internal circuits.

In some examples, the embodiments described herein improves ESD tolerance level for GHz range high speed pins in Silicon-Germanium (SiGe)/Bipolar/Bipolar CMOS (BiCMOS) technologies. The ESD protection schemes described herein may be applied to some pins or all pins of the IC. For examples, a pin that is configured to consume a GHz frequency signal may be equipped with the ESD protection circuit described herein and the other pins may continue to use a typical ESD clamp circuit for the ESD protection. The embodiments described herein use a combination of series resistor and a diode from a pin's floating ESD rail to a power supply (Vcc) terminal. The improved ESD protection circuit makes use of a small size bipolar transistor to meet the high speed requirement while providing a desired ESD tolerance level. In some embodiments, the bipolar transistor can be a NPN heterojunction bipolar transistor. In some other embodiments, CMOS transistors may also be used depending on the frequency of the operation and power requirement of the internal circuit of the IC.

In some embodiments, to save space, instead of having a dedicated ESD clamp for each pin of the IC, a floating ESD rail is employed that is coupled with the pins of the IC and to one ESD clamp for all pins connected to a same ESD rail. Rail based ESD clamping hides ESD parasitic behind a reverse biased diode without clamping the pin to the power supply. Having a floating ESD rail saves area by sharing rail clamp for all the pins that sharing the same ESD rail.

In one embodiment, the ESD protection circuit is connected between a power supply (Vcc) rail and a ground supply rail and includes an internal floating ESD rail located between the power supply rail and the ground supply rail, pins connected between the internal floating ESD rail and the power supply rail, ESD diodes corresponding to at least one pin, and configured to short the corresponding pin to the internal floating ESD rail when the pin is pulled high.

FIG. 1 depicts a circuit 100 (incorporated in and IC) with an ESD protection using a bypass diode $D_E$. Note that for the simplicity of explanation, other components and pins of the IC are not shown. As shown, the circuit 100 includes a pin 106, a transistor 104 coupled with the pin 106 and a internal circuit (CKT) 108. In some examples, the diode $D_E$ may be a parasitic diode form between the base and the collector of the transistor 104. The value of the diode $D_E$ may depend on the size of the transistor 104. The CKT 108 is configured to process signals in high frequency range (e.g., in GHz range). The details of the CKT 108 are omitted because the ESD protection schemes described herein would provide ESD protection to the CKT 108 irrespective of the function of the CKT 108. This embodiment may provide a desirable ESD protection (typically up to 2 KV ESD voltage) to the transistor 104 without an enhanced ESD protection if the size of the transistor 104 is larger than 28 $\mu m^2$. However, the transistor 104 of this large size will create a larger parasitic capacitance, thus reducing the maximum operating frequency (due to the RC filter frequency being inversely proportional to the capacitance). Therefore, at higher frequencies, a transistor 104 needs to be smaller than 28 $\mu m^2$.

In some examples, the transistor 104 is an NPN type bipolar junction transistor that provides more efficient operation as required in GHz frequency operating range. In some examples, the size of the transistor 104 is less than 28 $\mu m^2$. The collector of the transistor 104 is coupled with the power supply (Vcc) rail and the emitter is coupled with the CKT 108. The base of the transistor 104 is coupled with the pin 106. The pin 106 and the base of the transistor 104 are coupled with a floating ESD rail 102 via a reverse bias diode $D_T$. The pin 106 and the base of the transistor 104 are also coupled with the ground supply rail through a diode $D_B$. The parasitic capacitance (added to the pin 106) caused by the diodes $D_T$ and $D_B$ is more pronounced at higher frequencies. Therefore, to avoid frequency bandwidth degradation due to the parasitic capacitance, the size of the diodes $D_T$ and $D_B$ needs to be reduced. However, this reduction in the size of the diodes $D_T$ and $D_B$ also reduces the level of ESD protection that the floating ESD rail 102 provides. Adding the diode $D_E$ between the base and the collector of the transistor 104 provides a second path for sink ESD current, thus increasing the ESD protection level.

Using a relatively larger size transistor 104 and larger size ESD diode (e.g., $D_T$) will provide a robust and a higher ESD tolerance level, the increased parasitic capacitor will reduce the operational bandwidth of the pin 106. In some embodiments, the transistor 104 can be one transistor in a differential pair (not shown). The remaining transistor(s) in the differential pair may be included in the CKT 108. The transistor 104 may also be an input transistor of a buffer of a level shifter (inside the CKT 108). During an ESD event, the transistor 104 is under stress and its base can be damaged, especially when the size of the transistor 104 is close to minimum possible under the fabrication technologies.

During an ESD event, the charge is expected to go from the diode $D_T$ to the floating ESD rail 102. The diode $D_E$ provides an additional the path for the charge to sink. However, the distribution of the charge in the two paths (e.g., via DT and via DE) may to reliable to protect the transistor 104 in all ESD event scenarios and ESD voltage levels because the pin 106 to the base of the transistor 104 path will provide a relatively less resistance path to the ESD current compared to the path to the floating ESD rail 102 and may cause damage to the transistor 104 (and the CKT 108). Further the size of the diode $D_E$ needs to be big enough to effectively protect the transistor 104. However, making the diode $D_E$ bigger would reduce the operational frequency range due to a larger parasitic voltage. The amount of the ESD voltage may not be predictable, hence, a reliance of the bigger size of the diode $D_E$ and $D_T$ may not provide a reliable protection because the size can only be calculated for a possible maximum ESD voltage. Besides, the bigger diodes will reduce the operational frequency range due to a higher parasitic capacitance at the pin 106.

Figure 2:
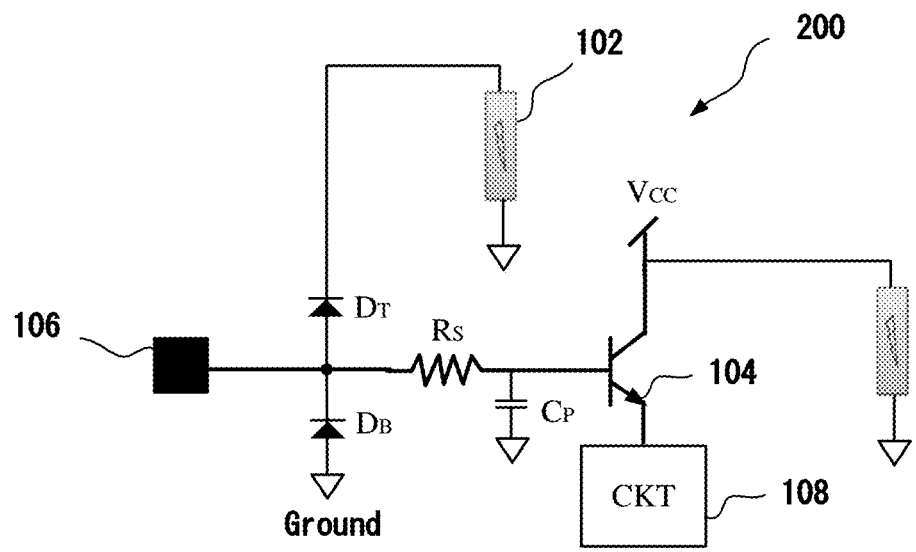
FIG. 2 depicts a circuit with an ESD protection using a resistor coupled to an IC pin or pad in accordance with one or more embodiments of the present disclosure.

FIG. 2 shows a secondary ESD protection circuit 200 that uses a resistor RS between the base of the transistor 104 and the pin 106. The resistor $R_S$ in combination of the capacitor $C_P$ (which may be a parasitic capacitor). However, the value of the resistor $R_S$ should be large enough to provide a reasonable protection by limiting the current goes the transistor 104, else the current will find an easier path via the resistor $R_S$ and may damage the transistor 104. Hence, the value of the resistor $R_S$ should be large enough such that the path through the diode $D_T$ is less resistive than the path through the resistor $R_S$. However, a larger value $R_S$ will reduce the bandwidth (the bandwidth of a RC filter $\sim 1/(2*\pi*R_S*C_P)$ is inversely proportional to the value of $R_S$ and $C_P$, which may be equal to the parasitic capacitor). In some embodiments, combining the circuits of FIG. 1 and FIG. 2 may provide a better ESD protection as compared to the individual solutions of FIG. 1 and FIG. 2.

Figure 3:
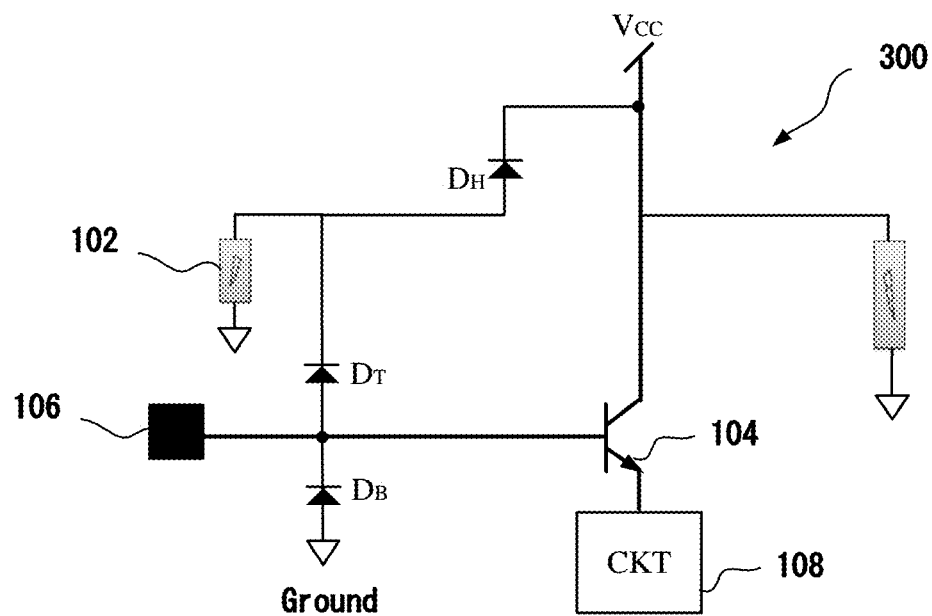
FIG. 3 depicts a circuit with an ESD protection using a diode between the floating ESD rail and the supply terminal in accordance with one or more embodiments of the present disclosure.

FIG. 3 shows a secondary ESD protection circuit 300. The secondary ESD protection circuit 300 includes a diode $D_H$ coupled between the floating ESD rail 102 and the power supply rail. As evident, during an ESD event, the charge has two paths, one through the ESD rail 102 and another through the diode $D_H$. This takes the charge away from the transistor 104 without substantially degrading the bandwidth of operation. The diode $D_H$ provides a more predictable path to the ESD charge to be dumped to the supply pin. The size of the diode DH can be determined such that the path through the floating ESD rail 102 remains the primary ESD charge dumping path.

Figure 4:
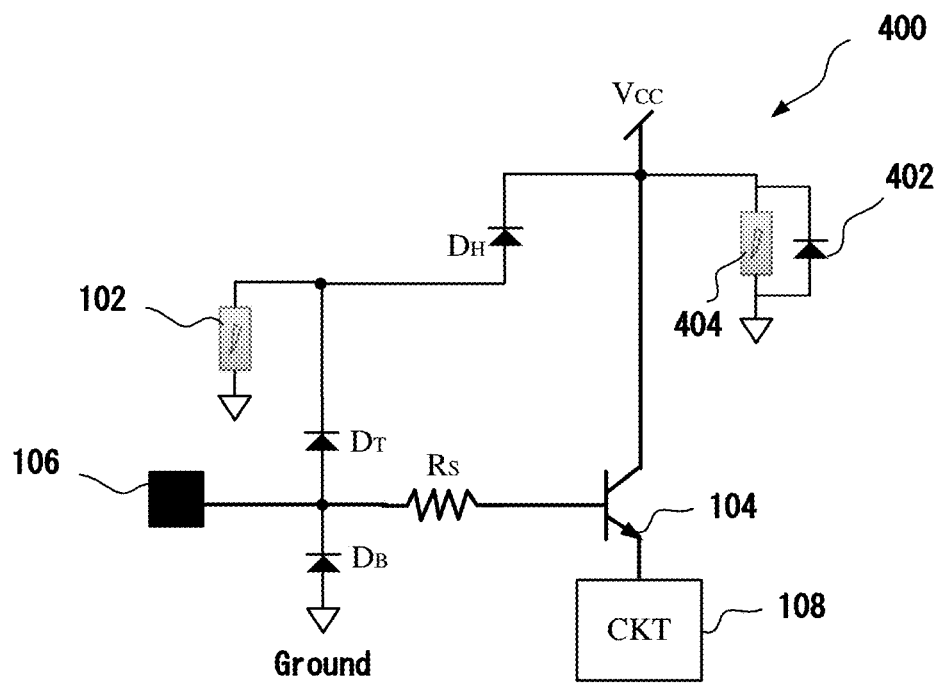
FIG. 4 depicts a circuit with an ESD protection using a diode between the floating ESD rail and the supply terminal and a resistor coupled to the IC pin or pad in accordance with one or more embodiments of the present disclosure.

FIG. 4 shows a secondary ESD protection circuit 400. The secondary ESD protection circuit 400 adds the resistor $R_S$ between the pin 106 and the base of the transistor 104. The size of the resistor $R_S$ can be small because the resistor $R_S$ is to provide additional protection in addition to the protection provided by the embodiment described in FIG. 3. The size of the resistor $R_S$ can be calculated through calibration based on a desired amount of additional ESD voltage protection while keeping the frequency of operations within a desirable range. The value of the resistor $R_S$ can be lower than 100 ohms because even a small value will create more resistance in the path between the base of the transistor 104 and the pin 106 due to the presence of forward bias diodes $D_T$ and $D_H$ in the alternative path. In some examples, the value of the resistor $R_S$ can be approximately 50 ohms and the size of the transistor 104 can be less than 20 $\mu m^2$. The lower the sizes of the transistor 104 and the resistor $R_S$, the higher the cut-off frequency of the RC filter that is created by the resistor $R_S$ and the parasitic capacitance of the transistor 104. In some embodiments, if an even higher level of ESD protection is needed, the value of the resistor $R_S$ can be increase or adjusted based on a desired frequency bandwidth requirements (as stated above, an increase in the value of the resistor RS will lower the cut-off frequency of the RC filter created through the resistor $R_S$ and the parasitic capacitance $C_P$, hence reducing the frequency bandwidth). In some examples, with this improved ESD protection, the size of the transistor 104 can be calculated to withstand normal operating voltages without factoring an additional size to withstand ESD events. In some examples, to further enhance the ESD protection level, the diode DH may also be coupled to a second ESD rail 404. A diode 402 may be connected across the two terminals of the second floating ESD rail 404.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein.

Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An integrated circuit (IC), comprising:
a pin to electrically connect the IC to an external circuit, wherein the pin is coupled to an internal circuit that is configured to operate in a preselected minimum operating frequency range;
a transistor including a base, a collector and an emitter, wherein the base is coupled with the pin;
a resistor coupled between the base and the pin;
a floating electrostatic discharge (ESD) rail coupled to the pin through a first ESD diode; and
a second ESD diode coupled between the floating ESD rail and a power supply to provide a second ESD current sink path.

2. The IC of claim 1, the internal circuit is coupled to the emitter of the transistor and the collector of the transistor is coupled with the power supply.

3. The IC of claim 1, wherein a lower end of the preselected minimum operating frequency range is greater than 1 GHz.

4. The circuit of claim 1, wherein the resistor is less than 100 ohms in value to provide a higher cut-off frequency of an RC filter created by the resistor and an parasitic capacitance of the transistor.

5. The circuit of claim 1, wherein the size of the transistor is less than 28 µm2 to provide a higher cut-off frequency of an RC filter created by the resistor and an parasitic capacitance of the transistor.

6. The circuit of claim 1, further including a second ESD rail coupled to the second ESD diode, wherein the second floating ESD rail includes a diode coupled across terminals of the second ESD rail.

7. The circuit of claim 1, wherein the transistor is a heterojunction bipolar transistor.

8. The circuit of claim 1, further including a third ESD diode coupled between the pin and the ground.

9. The circuit of claim 1, wherein the value of the resistor, the first ESD diode and the second ESD diode is preselected based on the preselected minimum operating frequency range.

10. An integrated circuit (IC), comprising:
a pin to electrically connect the IC to an external circuit, wherein the pin is coupled to an internal circuit that is configured to operate in a preselected minimum operating frequency range;
a transistor including a base, a collector and an emitter, wherein the base is coupled with the pin;
a resistor coupled between the base and the pin;
a floating electrostatic discharge (ESD) rail coupled to the pin through a first ESD diode;
a second ESD diode coupled between the floating ESD rail and a power supply to provide a second ESD current sink path; and
a second ESD rail coupled to the second ESD diode, wherein the second floating ESD rail includes a diode coupled across terminals of the second ESD rail.

11. The IC of claim 10, the internal circuit is coupled to the emitter of the transistor and the collector of the transistor is coupled with the power supply.

12. The IC of claim 10, wherein a lower end of the preselected minimum operating frequency range is greater than 1 GHz.

13. The circuit of claim 10, wherein the resistor is less than 100 ohms in value to provide a higher cut-off frequency of an RC filter created by the resistor and an parasitic capacitance of the transistor.

14. The circuit of claim 10, wherein the size of the transistor is less than 28 µm2 to provide a higher cut-off frequency of an RC filter created by the resistor and an parasitic capacitance of the transistor.

\* \* \* \* \*